United States Patent [19]

Kitajima et al.

[11] 4,334,006

[45] * Jun. 8, 1982

[54] PEEL-APART PROCESS FOR FORMING RELIEF IMAGES

[75] Inventors: Masao Kitajima; Hiromichi Tachikawa; Fumiaki Shinozaki; Tomoaki Ikeda, all of Asaka, Japan

[73] Assignee: Fuji Photo Film Co., Ltd., Kanagawa, Japan

[*] Notice: The portion of the term of this patent subsequent to Jul. 8, 1997, has been disclaimed.

[21] Appl. No.: 139,623

[22] Filed: Apr. 14, 1980

Related U.S. Application Data

[63] Continuation of Ser. No. 966,990, Dec. 6, 1978, abandoned.

[30] Foreign Application Priority Data

Dec. 6, 1977 [JP] Japan .................. 52-145685

[51] Int. Cl.³ .................. G03C 11/12; G03C 5/00; G03C 5/18
[52] U.S. Cl. .................. 430/254; 430/141; 430/142; 430/143; 430/145; 430/162; 430/166; 430/167; 430/175; 430/176; 430/190; 430/192; 430/197; 430/253
[58] Field of Search ............ 430/254, 253, 175, 176, 430/190, 192, 197, 142, 145, 141, 162, 166, 167, 143

[56] References Cited

U.S. PATENT DOCUMENTS

| | | | |
|---|---|---|---|
| 2,729,562 | 1/1956 | Zemp | 96/75 |
| 2,772,160 | 11/1956 | Hepher | 96/91 R |
| 3,060,023 | 10/1962 | Burg et al. | 430/254 |
| 3,607,264 | 9/1971 | Celeste et al. | 430/254 |
| 3,671,236 | 6/1972 | Van Beusekom | 96/83 |
| 3,681,066 | 8/1972 | McGuckin | 96/49 |
| 3,721,557 | 3/1973 | Inoue | 96/91 D |
| 3,884,693 | 5/1975 | Bauer et al. | 96/83 |
| 3,996,056 | 12/1976 | Muller | 96/83 |
| 4,002,478 | 1/1977 | Kokawa et al. | 96/28 |
| 4,008,084 | 2/1977 | Ikeda et al. | 96/35 |
| 4,050,936 | 9/1977 | Takeda et al. | 96/28 |
| 4,081,282 | 3/1978 | Merrill et al. | 96/35.1 |
| 4,175,964 | 11/1979 | Uchida et al. | 430/253 |
| 4,205,989 | 6/1980 | Moriya et al. | 430/253 |
| 4,210,711 | 7/1980 | Kitajima et al. | 430/254 |

FOREIGN PATENT DOCUMENTS

| | | |
|---|---|---|
| 986773 | 4/1976 | Canada ............ 430/253 |
| 38-9663 | 6/1962 | Japan . |
| 51-39025 | 4/1976 | Japan . |
| 51-141003 | 12/1976 | Japan . |
| 52-57819 | 5/1977 | Japan . |
| 52-126220 | 10/1977 | Japan . |
| 53-3215 | 1/1978 | Japan . |
| 53-23632 | 3/1978 | Japan . |

OTHER PUBLICATIONS

Chemical Abstracts, vol. 77, Abstract #95357y, 1972, (Landau et al.).
Chemical Abstracts, vol. 87, Abstract #192126w, 1977, (Inoue et al.).
Chemical Abstracts, vol. 88, Abstract #30394r, 1978, (Moriya et al.).

*Primary Examiner*—Charles L. Bowers, Jr.
*Attorney, Agent, or Firm*—Sughrue, Mion, Zinn, Macpeak and Seas

[57] ABSTRACT

A process for forming an image is disclosed wherein a photo-sensitive material composed of a support and a layer of a photo-sensitive composition containing a diazonium compound, an o-quinonediazide compound or an aromatic azide is exposed and developed by heating in intimate contact with a peeling development carrier sheet, and subsequently, peeling the carrier sheet from the photo-sensitive material.

17 Claims, 5 Drawing Figures

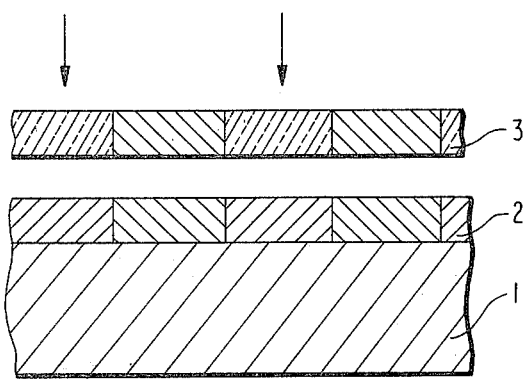
FIG 1
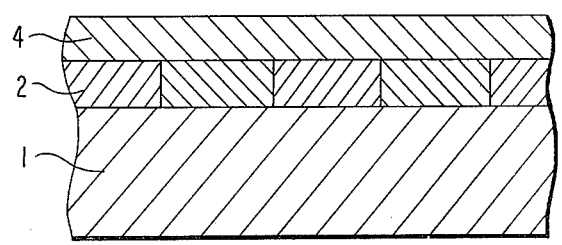
FIG 2
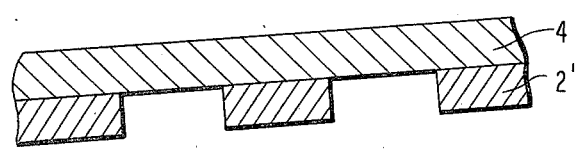
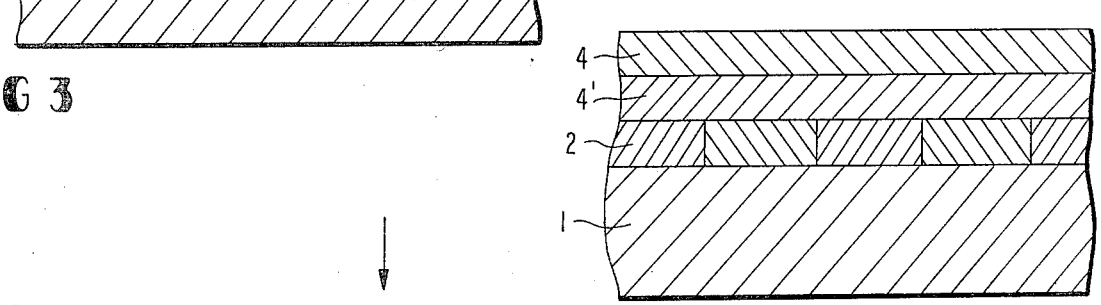
FIG 3
FIG 4
FIG 5
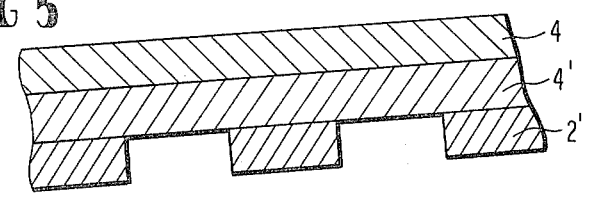
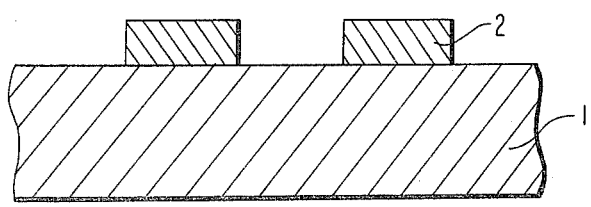

PEEL-APART PROCESS FOR FORMING RELIEF IMAGES

This is a continuation of application Ser. No. 966,990, filed Dec. 6, 1978, now abandoned.

BACKGROUND OF THE INVENTION

1. Field of the Invention

This invention relates to a process for forming an image, and more particularly to a method for obtaining a relief image which comprises imagewise exposing a photo-sensitive image-forming material and subjecting it to peeling development.

2. Brief Description of the Prior Art

Many methods for forming images by development of a photo-sensitive compositions have been suggested which include, for example, developing an exposed photo-sensitive material by heating a thermal-developing method, by using a suitable radiation ray, by treatment with a gas, by an electrostatic treatment, and by the application of pressure.

One typical dry method is the so-called peeling development process utilizing a photo-sensitive image-forming material comprising a support having thereon layer of a photo-sensitive composition and a cover sheet on the photo-sensitive layer in which the adhesion of the photo-sensitive layer to the support and the cover sheet changes upon exposure. After exposure, the cover sheet is peeled from the support leaving the exposed areas of the photo-sensitive layer on the support or the cover sheet and the unexposed area on the other, both being a relief image.

Image formation by peeling development is simpler than ordinary liquid development, which relies upon a large quantity of water or solvent, because it is conducted in the dry state. Furthermore, only the image area of the photo-sensitive image-forming composition layer remains on the support after peeling, the non-image area is removed. As a result stabilization, that is fixing, of the non-image area essential to photo-sensitive materials developed by an ordinary liquid developing method or thermodeveloping method, can be performed simultaneously with the developing operation. Also in the peeling development method, the photo-sensitive composition in the non-image areas is fixed to the peeled sheet as a solid layer and it can be disposed of easily, which is desirable from the environmental standpoint. When the composition contains useful ingredients, they can be completely recovered and easily re-used. Thus, this processing method is advantageous from the viewpoint of saving resources, too.

Since the time a general procedure for image formation by peeling was published in Japanese Patent Publication No. 9663/63, numerous techniques for peeling development have been suggested. These techniques, are classified based their characteristic features, and are briefly described below.

A three-layer structure composed of a support having thereon a photo-sensitive layer containing a photopolymerizable monomer and a cover sheet laminated to the photo-sensitive layer constitutes an important basis of this art. Peeling development of this type of photo-sensitive material is performed based on the fact that polymerization occurs in the exposed area of the material when the material is exposed imagewise, and the adhesion of the photo-sensitive layer to the support and to the cover sheet differs between the exposed and unexposed area. This is described, for example, in Japanese Patent Publication No. 3193/62 (corresponding to U.S. Pat. No. 3,060,024), Japanese Patent Publication No. 22901/68 (corresponding to U.S. Pat. No. 3,353,955), Japanese Patent Application (OPI) No. 7728/72 (corresponding to U.S. Pat. No. 3,770,438), and U.S. Pat. Nos. 3,060,023 and 3,525,615.

U.S. Pat. Nos. 3,627,529, 3,591,377 and 3,607,264 disclose a similar peeling development photo-sensitive materials consisting essentially of support, photo-sensitive layer and transparent cover sheet in which the photo-sensitive composition contains a photocurable polyester (U.S. Pat. No. 3,591,377), a photocurable olefin compound (U.S. Pat. No. 3,607,264) or a photo-curing catalyst and a thiol-containing olefin polymer (U.S. Pat. No. 3,627,529).

The methods described above achieve peeling development based on changes in adhesion incident to the photochemical reaction of a photopolymerizable monomer or a photocurable compound. Methods using other photo-sensitive compounds are also known. For example, Japanese Patent Application (OPI) No. 57819/77 discloses a method which relies on a laminate structure composed of a sheet consisting of a support having formed thereon an adhesive composition layer, and a transparent plastic film coated with a photo-sensitive composition comprising a diazonium salt and a binder, wherein the laminate structure is exposed, and then peeled to leave the unexposed area of the photo-sensitive composition layer on the transparent plastic film and the exposed area on the support.

Japanese Patent Application (OPI) No. 3215/78 (U.S. patent application Ser. No. 810,828, filed June 28, 1977) and No. 126220/77 disclose a photo-sensitive material composed of a photo-sensitive composition layer, a support and a thin film layer comprising a metal or chalcogen compound provided between the support and the photo-sensitive layer, and optionally containing a sheet having an adhesive composition layer formed on the photo-sensitive layer. This sheet is developed based on the phenomenon that peeling development after exposure induces selective separation at the interface between the non-sensitive thin film layer and the support.

In the invention disclosed in Japanese Patent Application (OPI) No. 23632/78, a photo-sensitive composition containing a polyhalogen compound and a polymer having a phenol nucleus is used, and by peeling the transparent film-like material adhering to the photo-sensitive composition layer before or after exposure, an image corresponding to the exposed image is obtained on the support.

British Pat. No. 1,319,295 discloses a peeling development method which comprises laminating a heat-softenable polymeric layer and a powder capable of absorbing infrared rays to a support, exposing the resulting material to infrared rays to impart tackiness imagewise to the heat-softenable polymeric layer, and separating the polymeric layer from the support to form an image on the support.

So far, the basic characteristics of known techniques for image formation by peeling development have been described. Heretofore, the basic principle of peeling development has been the difference in adhesion between the photo-sensitive composition layer and the support induced by exposure to light. For example, according to peeling development, a photopolymerizable or photocurable photo-sensitive composition is used, and upon exposure the adhesion of the photo-chemical composition in the exposed area, decreases or increases from that before exposure, whereby images are formed in the exposed area and the unexposed areas as on different supports. For example, Japanese Patent Publication No. 9663/63 suggests a method for forming an image which have been suggested comprise exposing a photo-sensitive composition in intimate contact with a cover sheet and peeling the cover sheet utilizing the fact that the photo-sensitive adhesive layer has suitable tackiness at room temperature.

On the other hand, Japanese Patent Application (OPI) Nos. 57819/77, 3215/78 (U.S. patent application Ser. No. 810,828, filed June 28, 1977, now abandoned) and 141003/76, for example, disclose a method in which the adhesiveness of the photo-sensitive composition layer itself at room temperature is not essential. In such a method, the adhesiveness required for peeling development is obtained by providing a pressure-sensitive adhesive layer on the peeling sheet used as a cover sheet. In these techniques, an adhesive peeling sheet is adhered intimately to the photo-sensitive composition layer before or after imagewise exposure, and then it is peeled off. Accordingly, there is more latitude in the selection of the characteristics of the photo-sensitive composition than with the aforesaid methods which rely solely on a photo-polymerizable compound and utilize the tackiness of the photo-sensitive composition layer itself at room temperatures.

Some techniques which improve the delineation of the image by heating the image-forming material at the time of peeling have been disclosed. For example, U.S. Pat. No. 3,060,023 discloses a method which comprises using a mixture of a photopolymerizable monomer and a thermoplastic polymer as a photo-sensitive composition layer, and after exposure, bringing the photo-sensitive layer into intimate contact with a receptor sheet at a temperature of at least 40° C. to thereby selectively soften the unexposed area, i.e., the unpolymerized area of the photopolymerizable monomer, and thermally transfer the image to the receptor sheet. That technique utilizes the transfer of the unexposed (unpolymerized) area of the thermoplastic photopolymerizable composition to the receptor sheet under heat, and it enables a large number of copies by bringing the exposed photopolymerizable composition layer into contact with a suitable support to transfer the unexposed area under heat. Since in this method, a transfer image composed of the unpolymerized area is always utilized as the image, when it is desired to utilize the image obtained on the support further for a printing plate or a photoresist, it is necessary to provide an additional step of curing the transferred image by after treatment, such as exposure.

Japanese Patent Application (OPI) No. 39025/76 discloses a method which comprises imagewise exposing a three-layer image-forming material composed of a metal substrate, a layer of a photo-sensitive composition comprising an addition-polymerizable monomer and polyvinyl butyral and a cover sheet, and peeling the exposed material while heating it, thereby to induce cohesive destruction of the unexposed area (i.e., unpolymerized area) of the photo-sensitive layer and to obtain the same positive image as used in imagewise exposure on the metal substrate which image is utilized as a photoresist image.

Thus, there are examples in which heating is performed at the time of peeling. All of these examples use a layer of a photopolymerizable composition, and facilitate the transfer of an image to an image-receiving sheet by increasing the flowability of the unexposed area through heat.

One method for obtaining a transfer image from a photo-sensitive image-forming material containing an azide compound by dry processing is disclosed in German Pat. No. 1,926,658. This method produces an image on a pre-treated image-receiving sheet by thermal transfer. However, only a sublimable ingredient is transferred to the image-receiving sheet and this results in the formation of a visible image, but no relief image is formed.

In contrast, according to the method described in Japanese Patent Application (OPI) No. 57819/77, an adhesive composition layer is provided in intimate contact with the photo-sensitive composition layer composed of a diazonium compound and a binder, and after imagewise exposure, the two elements are peeled from each other to give a relief image corresponding to the exposed image.

SUMMARY OF THE INVENTION

A principal object of the present invention is to provide a process for peeling development wherein the peeling development carrier sheet is not adhesive or tacky at room temperature.

Another object of the present invention is to provide a peeling development method wherein a diazonium compound or an aromatic azide compound is used as the photo-sensitive material.

A further object of this invention is to provide a process for peeling development wherein the photo-sensitive layer is not adhesive or tacky at room temperature.

Still a further object of the present invention is to provide a peeling development method which does not require the application of a cover sheet prior to exposure such that intimate contact can be maintained between the photo-sensitive layer and a transparency.

The present invention provides a method for forming an image which comprises imagewise exposing a photo-sensitive image-forming material composed of a support having coated thereon a layer of a photo-sensitive composition which is solid at ordinary temperature (The term "ordinary temperatures" as used herein means about 5° C. to about 40° C.) and is not adhesive (is not tacky) but will soften upon heating, and intimately contacts the exposed material under heat with a sheet-like carrier having a heat-softenable plastic layer which is not adhesive at ordinary temperatures (by, for example, passing the two elements between heated rollers), and then separating the image-forming material from the peeling development carrier to thereby fix the exposed area or unexposed area of the photo-sensitive layer selectively to the peeling development carrier sheet and fix the corresponding relief image to the support.

A characteristic feature of this invention is that an image-forming material having a layer of a photo-sensitive composition containing a diazonium compound or azide compound and a thermoplastic binder is imagewise exposed, and then heated in intimate contact with a peeling development carrier sheet which is not adhesive at least at ordinary temperatures, after which the two elements are separated from each other to transfer and adhere the exposed (or unexposed) area of the photo-sensitive composition layer selectively to the peeling development sheet-like carrier, and simultaneously form a relief image composed of the corresponding unexposed (or exposed) area on the support.

Another characteristic feature of the invention is that the photo-sensitive composition layer consists of a solid layer which is not tacky at ordinary temperatures. Since it is not tacky, it is not necessary to apply a cover sheet before exposure, which is essential when using a photo-sensitive layer containing a photopolymerizable monomer flowable or tacky at ordinary temperatures. As a result of not requiring a cover sheet, the transparency and the photo-sensitive layer used in exposure can be maintained in the completely adhered state. Accordingly, disorders such as scattering, reflection, etc. of irradiating light experienced when a cover sheet is present can be minimized. Thus, a marked improvement in the resolving power of the images, considered to be defective in conventional peeling development methods is brought about. For example, according to the method of this invention, images having a line width of 5μ can be resolved without great difficulty.

The present invention will be described in greater detail below.

BRIEF DESCRIPTION OF THE DRAWINGS

FIG. 1 illustrates a photo-sensitive image-forming material being exposed to a transparency in accordance with the present invention.

FIG. 2 illustrates the exposed image-forming material in intimate contact with the peeling development carrier sheet.

FIG. 3 shows separation of the peeling development carrier sheet from the image-forming material.

FIGS. 4 and 5 illustrate a further embodiments of the present invention.

DETAILED DESCRIPTION OF THE INVENTION

The photo-sensitive composition used in this invention comprises a diazonium compound or an azide compound and a thermoplastic binder and optionally contain additives to, for example, preserve and stabilize the photo-sensitive material, improve the performance of forming images and peeling development or render the images visible, as well as for other purposes.

The aromatic diazonium compounds suitable for use in this invention are represented by the general formula $ArN_2{}^+X^-$ wherein $N_2$ represents the diazonium group ($-N^-\!\!=\!\!N^+$), and Ar represents the aromatic moieties well known to those skilled in the art as being useful for forming stable photo-sensitive diazonium compounds ("Stable" meaning the composed is stable under nonactinic light, i.e., visible light and near infrared light). This moiety is described, for example, in J. Kosar, *Light-Sensitive Systems,* John Wiley & Sons, Inc., New York., N.Y. (1965), pages 202–214, and Glafkides, *Photographic Chemistry* Vol. II, Fountain Press, London, England (1960), pages 709–725.

The diazonium salts which can be used in this invention are classified according to their chemical structures, and illustrated below.

The Ar moiety in the compounds of the general formula represents an N-substituted-4-aminobenzenediazonium group, an N,N-substituted-4-amino-substituted benzenediazonium group or an S-substituted-4-mercaptobenzenediazonium group, and X represents an anion. The N-substituted amino group includes, for example, an alkylamino group, a dialkylamino group, a dialkylamino group wherein the two alkyl groups are different from each other (Examples of the alkyl group are methyl, ethyl, propyl, isopropyl or the like), a phenylamino group or a heterocyclic group such as a morpholino, a piperidino, a piperazinyl or a pyrrolidinyl group. The benzene ring may be substituted by an alkyl group, an alkoxy group, a phenoxy group or a trifluoromethyl group or a halogen atom. The substituted mercapto group may be an alkylthio or arylthio group (Examples of the alkyl group being the same as for alkylamino. The aryl groups include phenyl, tolyl, ethylphenyl, naphthyl, etc.) Examples of the anion are those of a metal halide such as zinc chloride or stannic chloride, a boron compound such as tetrafluoroborate or tetraphenyl borate, perchloric acid, an organic acid such as p-toluenesulfonic acid, hexafluorophosphate, hexafluoroarsenate, and hexafluoroantimonate, They form normal salts or double salts with the above diazonium compounds to contribute to their stability.

Some of the diazonium salts of the general formula $ArN_2X$ are shown specifically below.

Diazonium salts containing a dialkylamino group as the N-substituted amino group are for example, 4-(N,N-diethylamino)benzenediazonium salt, 4-(N,N-dimethylamino)benzenediazonium salt, 2-methyl-4-(N,N-diethylamino)benzenediazonium salt, and 2-chloro-4-(N,N-diethylamino)benzenediazonium salt.

Diazonium salts containing a dialkylamino as the N-substituted amino group, the two alkyl groups being different from each other are, for example, 4-(N-methyl-N-ethylamino)benzenediazonium salt.

Diazonium salts containing a phenylamino group as the N-substituted amino group include 4-(N-ethyl-N-benzylamino)benzenediazonium salt, and 4-anilinobenzenediazonium salt.

Diazonium salts containing heterocyclic group as the N-substituted amino group in the aforesaid residue are, for example, 4-morpholinobenzenediazonium salt, 2,5-dibutoxy-4-morpholinobenzenediazonium salt, 2,5-diethoxy-4-morpholinobenzenediazonium salt, 2,5-diethoxy-4-morpholinobenzenediazonium salt, and 3-methyl-4-pyrrolidinylbenzenediazonium salt.

Diazonium salts containing as S-substituted-4-mercapto groups include 4-ethylmercapto-2,5-diethoxybenzenediazonium salt and 4-tolylmercapto-2,5-diethoxybenzenediazonium salt.

Also suitable are diazonium salts obtained by the polycondensation of diazodiphenylamine and formaldehyde. A specific example is a polymer having the following structure:

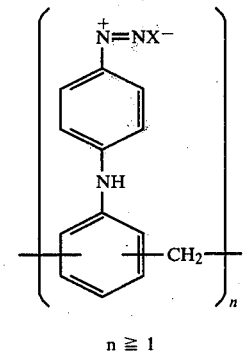

$n \geqq 1$ wherein X has the same definition as above,

Ortho- or para-quinonediazides can also be used in this invention. Specific examples are as follows:

Naphthalene-1,2-diazooxide-4-sulfonic acid; A compound of the formula

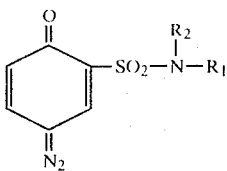

wherein $R_1$ is hydrogen, an alkyl group (e.g., methyl, ethyl, propyl, isopropyl, etc.) or an aralkyl group (e.g., benzyl, phenethyl, etc.) and $R_2$ is aryl group (e.g., phenyl, tolyl, ethylphenyl, naphthyl, etc.); A compound of the formula

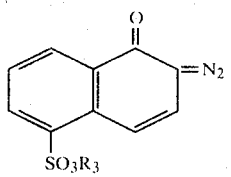

wherein $R_3$ is alkoxy (e.g., methoxy, ethoxy, propoxy, etc.), aryloxy (e.g., phenoxy, tolyloxy, etc.), alkylamino (e.g., methylamino, ethylamino, dimethylamino, diethylamino, etc.), aralkylamino (e.g., benzylamino, dibenzylamino, etc.) or carboxyalkoxyalkyl (e.g., carboxymethoxymethyl, etc.);

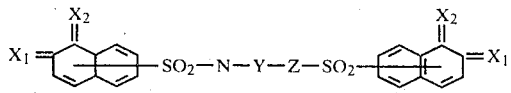

wherein $X_1$ and $X_2$ are $N_2$ or O, Y is arylene (e.g., phenylene, naphthylene, etc.) or alkylene (e.g., methylene, ethylene, trimethylene, tetramethylene, etc.), Z is O or $-NR_4$, $R_4$ is hydrogen, alkyl (e.g., methyl, ethyl, propyl, isopropyl, etc.) or aryl (e.g., phenyl, tolyl, ethylphenyl, naphthyl, etc.).

Especially useful diazonium salts for use in the process of this invention are those which have relatively high solubilities in organic solvents, and can be used in a relatively high concentration relative to the binder in forming an organic solvent solution of a photo-sensitive image-forming composition together with the binder, as will be described hereinbelow.

Usually, two means are available to achieve such conditions. A first means is to render the diazonium cation of the formula $ArN_2^\oplus$ in the general formula $ArN_2^\oplus \cdot X^\ominus$ oleophilic or less hydrophilic by, for example, introducing an alkoxy group into an aromatic ring. A second means is to render the anionic portion $X^\ominus$ oleophilic or less hydrophilic, and for this purpose, tetraphenyl borate, tetrafluoroborate, hexafluorophosphate, hexafluoroarsenate, p toluenesulfonic acid and hexafluoroantimonate are used instead of metal halides which are usually employed. These compounds form double salts together with the diazonium cations to increase their solubility in organic solvents.

As a result, even when a polymer is soluble in an organic solvent is used as a binder, the ratio of the diazonium salt to the binder can be increased to, for example, 1:5 or to 1:1, and a high concentration of the photosensitive material can be obtained. Thus, the ease of image formation is markedly enhanced.

These diazonium salts may be those rendered polymeric by known techniques. One example is a so-called diazo resin obtained by polycondensing p-diazodiphenylamine with formaldehyde.

The diazonium salts can also be added together with compounds capable of reacting with the diazonium salts to form dyes or stabilize them which are known to those skilled in the art as diazo couplers. When a diazo coupler is present together with the diazonium salt, it is possible to perform a coupling reaction after the formation of a relief image on the support, and thereby render the diazonium compound non-sensitive. Hence, the image is stabilized against light or heat and becomes more desirable.

Such a diazo coupler may be one which simultaneously induces a color-forming reaction, but it may also be one which merely renders the diazonium compound non-sensitive, in other words one which fixes the compound. Those having a high molecular weight are especially preferred for the formation of strong images.

Examples of such a diazo coupler are described, for example, at pages 215 to 248 of Kosar, Light-Sensitive System, supra, e.g., 3-acetamidophenol, 3-(N-3'-aminobenzoyl)aminophenol, m-hydroxybenzylalcohol, 1,2-dihydroxybenzene, 1,3-dihydroxybenzene, 4-fluororesorcinol, resorcinol-o-acetic acid, hydroquinone monomethyl ether, phloroglucinol, α-naphthol, 2,3-dihydroxynaphthalene, etc.

Aromatic azide compounds which can be used in this invention are those of the general formula $N_3$—$R$—$CH=CH$—$R_1$ in which R represents a phenylene group, and $R_1$ represents an acyl group (e.g., p-azidobenzoyl, benzoyl, 4-azido-1-sulfostyrylcarbonyl, etc.) or an azidoaryl group (e.g., p-azidophenyl, 4-azide-1-sulfophenyl, etc.). These compounds are well known to those skilled in the art from, for example, J. Kosar, Light-Sensitive Systems, pages 330–336, supra, e.g., 4,4'-azidostilbene-2,2'-disulfonic acid, 4'-azido-4-azidobenzalacetophenone-2-sulfonic acid, 4-azidobenzalacetophenone-2-sulfonic acid, 4,4'-azidochalcone, etc. Also compounds which are not include in the scope of the formula, $N_3$—$R$—$CH=CH$—$R_1$, such as 2,6-di(4'-azidobenzal)cyclohexanone, 2,6-di(4'-azidobenzal)-4-methylcyclohexanone and the like may be used.

Useful azide compounds of another class are those described at pages 93 to 97 of Photo-Sensitive Resins, Revised Edition, by Takahiro Tsunoda, published by the Publishing Department of the Japanese Society of Printing, 1975. W. S. DeForest, Photoresist: Materials and Processes, pp 19–62 (1975), McGraw-Hill Book Co., New York. Specifically, they include 2,6-dichloro-4-nitro-azidebenzene, azidediphenylamine, 3,3'-dimethoxy-4,4'-diazidodiphenyl, 4'-methoxy-4-azidodiphenylamine, 4,4'-diazidodiphenylamine, 4,4'-diazidodiphenylmethane, 4'-nitrophenylazobenzene-4-azide, 1-azidopyrene, 3,3'-dimethyl-4,4'-diazidodiphenyl, 4,4'-diazidophenylazonaphthalene, p-phenylene bisazide, p-azidobenzophenone, 4,4'-diazidobenzophenone, 4,4'-diazidochalcone, 2,6-di-(4'-azidobenzal)cyclohexane and 2,6-di-(4'-azidobenzal)-4-methylcyclohexanone.

Various film-forming compounds can be used as a binder for use in the photo-sensitive composition layer. In particular, polymers having good film formability are useful. As will be illustrated hereinbelow, one feature of the process of this invention is that a very broad range of compounds can be used. But it is necessary to select the best binders for the formation of image-forming materials by using the compatibility with the diazonium compounds or aromatic azide compounds as photo-sensitive compounds, the stability of the photosensitive layer, the adhesion to the support, and other characteristics as criteria.

Examples of suitable polymeric binder compounds include thermoplastic linear polymers such as polyvinyl butyral, polyvinyl formal, polystyrene, poly(methyl methacrylate), polyvinyl acetate, polyesters, polyamines, polyurethane and polyamides; binary copolymers such as a vinylidene/acrylonitrile copolymer, a styrene/acrylonitrile copolymer, a vinyl methyl ether/maleic anhydride copolymer, a vinyl acetate/maleic anhydride copolymer, a vinyl chloride/vinyl acetate copolymer or a vinyl chloride/styrene copolymer, and ternary or quaternary copolymers containing third and fourth comonomers. Partially crosslinked water-soluble polymers such as gelatin, polyvinyl alcohol or polyvinyl pyrrolidone, and compounds which are not thermoplastic themselves, such as epoxy resins, can be used if they are improved by mixing with thermoplastic binders or other additives to substantially impart heat-softenability to the photo-sensitive composition layer.

Polyethylene glycol, rosin, and waxes which have poor film-formability can be used as binders, but they should be used preferably with other polymeric binders to increase the heat-softenability of the photo-sensitive composition layer. These polymeric substances can be coated on a support when dispersed in an aqueous or organic solvent as a latex.

Examples of thermoplastic polymers which are particularly suitable for the binder used in the photo-sensitive composition of this invention include vinylidene chloride, a vinylidene chloride/acrylonitrile copolymer, polyvinyl butyral and the like. When the adhesive force of the binder to the peeling development sheet-like carrier at the peeling development treatment temperature employed is too weak, a good result could be obtained by further providing on the photo-sensitive composition layer a material which is thermoplastic at a relatively low temperature and exhibits tackiness or stickiness, e.g., polyvinyl butyral.

Furthermore, polyvinyl alcohol which is a hydrophilic binder can be advantageously used when the photo-sensitive substance used is hydrophilic. In such a case, a hydrophobic polymer can be used for coating in a latex form.

Plasticizers which are liquid or viscous at room temperature can be added in amounts which do not impair the shape of the photo-sensitive composition layer.

The peeling development effect in accordance with this invention can also be enhanced by adding organic or inorganic fine powders such as colloidal silica, starch, carbon black, glass powders and metal powders.

Based on the purpose for which the relief images are used, the photo-sensitive composition layer may also contain pigments or dyes, fine metal powders, and magnetic materials or fluorescent substances in a molecularly dispersed state or as crystals or fine powders.

The thickness of the photo-sensitive composition layer is generally from 0.5 $\mu$m to 500 $\mu$m, preferably from 1 $\mu$m to 100 $\mu$m.

The support used to support the photo-sensitive composition in the process of this invention may be any flat materials, for example, metal sheets such as aluminum, steel, zinc, iron, stainless steel, and brass, and hard non-flexible materials such as glass, ceramics, wood or plastics, and flexible materials such as paper, plastic films, fibrous materials, and vacuum-deposited films. The surfaces of any of these supports may be further processed by coating, vacuum deposition, lamination, polishing, roughening, electrode reaction, electric discharging, heating, and other known means.

The support may be transparent, non-transparent, or colored with dyes or pigments depending on whether the photo-sensitive material is used as a transparent visible image, a reflective image or a resist.

There is no particular restriction on the thickness or configuration of the support. In the case of a film or sheet, its thickness generally ranges from about 10 $\mu$m to several centimeters. Those having thickness outside this range can also be used if they permit coating and bonding and peeling at the time of heating.

The peeling development carrier sheet used in the process of this invention should be flexible and have suitable adhesion to the photo-sensitive composition layer at the time of bringing it into close contact by heating with the photo-sensitive composition layer. The materials which meet this requirement can be selected from plastic films of thermoplastic polymers and copolymers such as polyvinyl chloride, polyvinylidene chloride, polystyrene, polyethylene, polypropylene, polyamides, polyesters, cellulose acetate, polyurethane and polyurea, papers, metal foils and cloths, for example. For the purpose of adjusting the surface characteristics of these materials, they can be heat-treated or subjected to electric discharge, or a second component may be laminated to them by coating, vacuum deposition, press bonding, dyeing, etc.

Of these materials, those having a laminate structure are especially important. Papers on which polyethylene, polypropylene, or Saran is laminated, and a polyester support having a polymer with a low heat-softening temperature laminated to it (i.e., so-called heat-laminate films or heat adhesive films) are very useful. A peeling development sheet-like carrier which is especially effective for the practice of the method of this invention is a film (sold under the tradename Fuji Laminate Film by Fuji Photo Film, Co., Ltd.) consisting of a polyethylene terephthalate film and an ionomer (sold under the tradename Surlyn A by E. I. duPont de Nemours & Co., Inc.) laminated to it. It can be used widely in various photo-sensitive composition layers. Of these, a composite film having a thin layer of an ionomer (e.g., Surlyn A) or a thermoplastic polymeric material (e.g., polyethylene) laminated on a polyester (e.g., polyethylene terephthalate) film or the surface of paper, a polyvinyl chloride film and a polystyrene film can be exemplified as suitable peeling development carriers. Furthermore, a polyester (e.g., polyethylene terephthalate) film of a cellulose acetate (e.g., cellulose diacetate, cellulose triacetate, etc.) film can also be exemplified as suitable peeling development carriers if a high temperature is chosen as the heating temperature. Still further, when the thermoplastic binder polymer per se which is contained in the photo-sensitive composition has a strong adhesive force at the heating temperature employed and has a weak cohesive force in the photo-sensitive composition layer, paper can be used as the peeling development carrier of this invention.

In the process of this invention, the peeling development carrier sheet is applied after imagewise exposing the photo-sensitive layer, and therefore, the peeling development carrier may be transparent or non-transparent, colored, or filled with an inorganic or organic pigment or solid powder. For example, a structure obtained by laminating a $TiO_2$ powder onto a polyester film using cellulose triacetate as a binder is a very good carrier for peeling development.

The thickness of the carrier should be such as to give the strength required to peel the exposed or unexposed area of the photo-sensitive composition without breakage at the time of peeling development. A single or laminated plastic film or paper generally has a thickness of 10 μm to 2 mm, preferably from 15 μm to 0.5 mm.

In the heat laminating operation in the process of this invention, the temperature required differs depending on the construction of the photo-sensitive composition layer and the peeling development sheet, the heat-softening temperature of the photo-sensitive layer of the development sheet, the combination of the photo-sensitive composition layer and the developing sheet, etc. If the temperature is too low, the photo-sensitive layer does not adhere enough to the developing sheet, even when they are press-bonded by rollers, etc., and the adhesive strength required for effective peeling cannot be obtained. When the temperature is too high, the photo-sensitive layer and the peeling development sheet are markedly heat-softened, and may finally assume flowability. Thus, moderate peeling images cannot be obtained, and the images have reduced quality.

As is clear from the foregoing description, for image formation by peeling, the materials and constructions of the support, photo-sensitive layer, and the peeling development sheet, and the combination of these are very important, and the developing conditions cannot be determined by simply defined but can be determined easily without undue experimentation. Generally, however, the heat laminating temperature is from 60° to 300° C., preferably from 80° to 200° C.

The peeling development sheet and the photo-sensitive image-forming material which have thus been heat laminated are separated by a peeling operation. The temperature at the time of peeling is also very important. Generally, the temperature at the time of peeling is below the temperature, which is 50° C. or higher, at which the photo-sensitive image-forming material and the peeling development image are intimately adhered and heated.

Generally, when the peeling temperature is higher than the softening temperature of the photo-sensitive composition layer, cohesive destruction of the photo-sensitive layer occurs whereby a part of the area of the photo-sensitive layer which is to be separated by peeling development remains on the support, and a part of the area which is to remain on the support adheres to the peeling development carrier sheet remains. Thus, the resulting relief image tends to be incomplete. When the peeling temperature is higher than the softening temperature of the adhesive surface of the peeling development sheet, the peeling development sheet breaks or undergoes cohesive destruction on its adhesive surface. Hence, good quality relief images cannot be obtained.

Of course, the adhesion strength between the photo-sensitive composition layer and the support carrier affects the formation of relief images by peeling.

The peeling temperature which is optimal for the process of this invention also varies widely according to the combination of the supporting carrier, photo-sensitive composition layer and the peeling development sheet. Generally, the peeling temperature is from room temperature to 200° C., preferably from room temperature to 150° C.

Embodiments of the construction of the photo-sensitive image-forming material used in this invention and the process for image formation in accordance with this invention are described by reference to the accompanying drawings in which FIGS. 1 to 3 show one embodiment of the process for image formation in accordance with this invention; and FIGS. 4 and 5 show another embodiment of the process of this invention.

FIG. 1 shows the photo-sensitive image-forming material in accordance with this invention being exposed through an original image transparency. The photo-sensitive image-forming material composed of support 1 and photo-sensitive composition layer 2 formed thereon is imagewise exposed through the original image transparency 3.

FIG. 2 shows that the exposed image-forming material intimately contacted with peeling development carrier 4 under heat.

FIG. 3 shows separation of the peeling development carrier sheet from the image-forming material. The exposed area 2' of the photo-sensitive layer is transferred and adhered to the peeling development carrier, and the non-exposed area 2 remains on the support, respectively forming a relief image.

FIGS. 4 and 5 show another embodiment of the process of this invention. The photo-sensitive image-forming material consisting of photo-sensitive composition layer 2 and the support 1 is imagewise exposed, and brought into intimate contact with the peeling development carrier having a heat-softenable layer 4' under heat (FIG. 4). Then, they are separated from each other, whereby the exposed area 2' of the photo-sensitive layer is transferred and adhered to the peeling development carrier, and the non-exposed area 2 remains on the support, respectively forming a relief image (FIG. 5).

The following Examples illustrate the present invention in more detail. It should be understood however that the invention is in no way limited by these Examples.

EXAMPLE 1

2 g of 2,5-Dibutoxy-4-N,N-dimethylaminobenzenediazonium zinc chloride double salt and 2 g of a novolak resin (PR 50904, a trademark for a product of Arakawa Rinsan Co., Ltd.) were dissolved in a mixed solvent consisting of 20 ml of N,N-dimethyl formamide and 20 ml of tetrahydrofuran to form a photo-sensitive solution. The photo-sensitive solution was uniformly coated on an aluminum substrate by using a whirler to form a photo-sensitive composition layer having a dry film thickness of about 4 microns. The resulting photo-sensitive image-forming material was exposed for 100 seconds, through a positive transparency intimately adhered to it, is light from a high-pressure mercury lamp (100 W) disposed at a distance of 20 cm. Then, a heat-laminate film (Fuji Laminate Film, a product of Fuji Photo Film Co., Ltd.) was laid on the exposed image-forming material, and the assembly was passed between heated rollers held at a roller temperature of 130° C. to effect heat lamination. Immediately then, the laminate film was separated from the image-forming material.

A positive relief image of good quality consisting of the unexposed area of the photo-sensitive composition layer was obtained on the aluminum substrate. On the other hand, a negative relief image consisting of the exposed area of the photo-sensitive composition layer was obtained on the peeled laminate film.

EXAMPLE 2

2 g of 4-Morpholinobenzenediazonium boron tetrafluoride double salt (2 g) and 2 g of a copolymer of vinylidene chloride and acrylonitrile (Saran F-220, a trademark for a product of Asahi-Dow Co., Ltd.) were dissolved in 20 ml of N,N-dimethylformamide to form a photo-sensitive solution. The photo-sensitive solution was coated on an aluminum substrate which had been grained and anodized, thereby to form a photo-sensitive image-forming material. The image-forming material was exposed for 100 seconds through a positive photographic transparency intimately adhered to it to light from a 100 W high-pressure mercury lamp disposed at a distance of 20 cm. The same heat-laminate film as used in Example 1 was overlaid on the exposed image-forming material, and the assembly was passed between heated rollers held at a roller temperature of 150° C. The passing time was about 7 seconds. Immediately after passage between the rollers, the image-forming material was separated from the peeling development film. A positive relief image of good quality was formed on the aluminum substrate, and a negative relief image, on the laminate film.

EXAMPLE 3

Polyvinyl butyral (Denka Butyral 4002, a trademark for a product of Denki Kagaku Kabushiki Kaisha) was used as a binder instead of the Saran used in Example 2. The procedure of Example 2 was repeated, thereby to form a positive image of good quality on the aluminum substrate.

EXAMPLE 4

The procedure of Example 2 was repeated except that a styrene/acrylonitrile copolymer was used as a binder instead of the Saran used in Example 2. A positive image was obtained on the aluminum substrate.

EXAMPLE 5

The procedure of Example 2 was repeated except that m-cresol-type novolak resin (RP 50804, a trademark for a product of Arakawa Rinsan Co., Ltd.) was used instead of the Saran used in Example 2. A positive image was obtained on the aluminum substrate.

EXAMPLE 6

The procedure of Example 2 was repeated except that a 4-N,N-dimethylaminobenzenediazonium/boron tetrafluoride double salt was used instead of the photo-sensitive ingredient used in Example 2. A negative image of good quality was obtained on the aluminum substrate, and corresponding positive image, on the peel sheet.

EXAMPLE 7

The procedure of Example 2 was repeated except that 2 g of 2-diazo-1-naphthol-5-sulfonic acid ethyl ether was used instead of the photo-sensitive ingredient used in Example 2. A positive image of good quality was obtained on the aluminum substrate.

EXAMPLE 8

The procedure of Example 2 was repeated except that 4-N,N-diethylaminobenzenediazonium boron tetrafluoride double salt was used instead of the photo-sensitive ingredient used in Example 2. A negative image of good quality was obtained on the aluminum substrate.

EXAMPLE 9

The procedure of Example 2 was repeated except that a smooth aluminum plate not anodized was used instead of the support used in Example 2. A positive relief image of good quality was obtained on the aluminum plate.

EXAMPLE 10

The procedure of Example 2 was repeated except that a substrate composed of a polyethylene terephthalate sheet and a layer of aluminum having a thickness of about 1000 Å vacuum-deposited on it was used instead of the support used in Example 2. A positive relief image of good quality was obtained on the vacuum-deposited aluminum layer.

EXAMPLE 11

The procedure of Example 2 was repeated except that a support composed of a polyethylene terephthalate film and a subbing layer of gelatin formed on it was used instead of the aluminum substrate used in Example 2. A positive relief image of good quality was obtained on the support.

EXAMPLE 12

The procedure of Example 2 was repeated except that a support composed of an aluminum substrate and a 1 $\mu$m-thick polyvinyl alcohol layer was used instead of the aluminum substrate used in Example 2. A positive relief image of good quality was obtained on the support.

EXAMPLE 13

The procedure of Example 2 was repeated except that a photographic baryta paper having a gelatin layer was used instead of the aluminum substrate used in Example 2. A positive image of good quality was obtained on the baryta paper.

EXAMPLE 14

The procedure of Example 2 was repeated except that a medium-quality paper for printing was used as a peel sheet instead of the heat-laminate film used in Example 2. A good image was obtained on the aluminum substrate.

EXAMPLE 15

The procedure of Example 2 was repeated except that a polyethylene terephthalate film was used as a peel sheet instead of the heat-laminate film used in Example 2. A positive image was obtained on the aluminum substrate.

EXAMPLE 16

The procedure of Example 2 was repeated except that a paper having a polyethylene film laminated to its surface was used as a peel sheet instead of the heat-laminate film used in Example 2. A positive image of good quality was obtained on the aluminum substrate.

EXAMPLE 17

One gram of 4-N,N-dimethylaminobenzenediazonium boron tetrafluoride double salt and 3 g of a vinylidene chloride/acrylonitrile copolymer (Saran F-220, a trademark for a product of Asahi Chemical Industry Co., Ltd.) were dissolved in 45 ml of N,N-dimethylformamide to form a photo-sensitive solution. An aluminum substrate having a width of 23 cm and a length of 46 cm which had been grained and anodized was set on a whirler, and at a rotating speed of 100 rpm, 50 ml of the resulting photo-sensitive solution was cast onto the aluminum substrate. Then, the coating was dried with hot air, and heat-dried for 100 seconds in a constant temperature tank at 100° C. to form a photo-sensitive printing material. The film thickness of the photo-sensitive layer of this photo-sensitive printing material was about 4 μm. The printing material was contacted closely with a positive test chart original containing various halftone wedges under vacuum, and exposed for 20 seconds to light from a 2 KW ultra-high pressure mercury lamp (Jet Light, a trademark for a product of Orc Manufacturing Co., Ltd.) placed at a distance of 50 cm.

Then, the exposed material was held in intimate contact with the laminate layer of a heat-laminate film obtained by laminating a thermoplastic ionomer to a polyethylene terephthalate film (Fuji Laminate Film, a product of Fuji Photo Film Co., Ltd.), and the assembly was passed through a small-sized heat laminate (Fuji Laminater D-13, a product of Fuji Photo Film Co., Ltd.) held at a roller temperature of 150° C. to heatbond the photo-sensitive material and the laminate film on the laminater. Immediately after the passage of the material through the laminater, the laminate film was peeled from the photosensitive material.

On the aluminum substrate, only the unexposed area of the photo-sensitive composition layer remained to form a positive relief image of good quality. On the other hand, all of the exposed area of the photo-sensitive layer moved to the laminate film to form a negative relief image of good quality.

The printing plate so obtained was gummed by a gum solution ("Fuji PS plate gum Solution GU", a product of Fuji Photo Film Co., Ltd.), and then test printing was performed on an offset printing press (Hamada Star 600 CD). Very good copies were obtained from the beginning of printing to the time when the 5000th copy was obtained. By using a halftone measuring device Veuvac, a product of Toyo Ink Mfg. Co., Ltd.), the reproducibility of halftones was examined. It was confirmed that an original of 175 lines/inch was reproduced on the printing plate and on the printed copies over a halftone area of 5% to 95%.

A tone reproduction graph obtained by plotting the halftone percentage of the printed copy against the halftone percentage on the original gave substantially the same type of curve as that of a control test printing operation which was performed under the same conditions as above by using a printing plate by solution development of a commercially available diazo PS plate (PS Plate GAP, a product of Fuji Photo Film Co., Ltd.) in a specified manner.

EXAMPLES 18 TO 26

The same procedures as those used in Example 17 were followed except that the diazonium salts expressed by the formula:

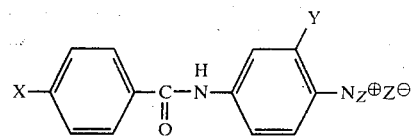

were used as the photo-sensitive compound to obtain the similar results to those in Example 17.

| Example No. | X | Y | $Z^-$ |
|---|---|---|---|
| 18 | H | $H_3CCH_2O$ | $BF_4^\ominus$ |
| 19 | $H_3CO$ | $H_3CO$ | $BF_4^\ominus$ |
| 20 | $H_3CO$ | $H_3CO$ | Q* |
| 21 | H | $H_3CO$ | $BF_4^\ominus$ |
| 22 | H | $H_3CO$ | Q* |
| 23 | $H_3CO$ | $H_3CCH_2O$ | $PF_6^\ominus$ |
| 24 | $H_3CO$ | $H_3CCH_2O$ | $BF_4^\ominus$ |
| 25 | $H_3CCH_2O$ | $H_3CO$ | $BF_4^\ominus$ |
| 26 | $H_3CCH_2O$ | $H_3CCH_2O$ | $BF_4^\ominus$ |

*Q stands for 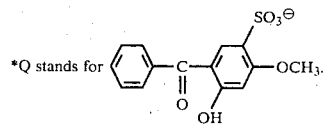

Of the diazonium salts set forth above, the case where 4-(4-methoxybenzamido)-2,5-diethoxybenzenediazonium hexafluorophosphate double salt was used, i.e., Example 23 gave particularly excellent results.

EXAMPLE 27

The same procedures as those used in Example 17 were followed except that a compound of the formula:

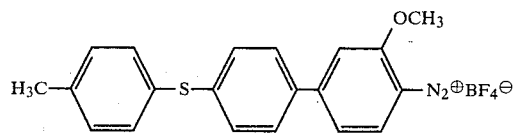

to obtain the similar results to those in Example 17.

EXAMPLE 28

One gram of p-anilinobenzenediazoniumhexafluorophosphate, 2 g of polyurethane and 0.1 g of α-naphthol were dissolved in 30 ml of N,N-dimethylformamide to form a photo-sensitive solution. In the same manner as in Example 1, the photo-sensitive solution was coated on a grained aluminum substrate, and dried. The resulting photo-sensitive image-forming material was exposed through a positive transparency in the same way as in Example 1, and then developed using a heat-laminate film (Fuji Laminate Film, a product of Fuji Photo Film Co., Ltd.) thereby to form a positive relief image on the aluminum substrate. The aluminum substrate was treated for 1 minute with 10.5% ammonia solution. The undecomposed diazonium salt forming the relief image on the substrate was coupled with α-naphthol to form a reddish brown image. The resulting image was fixed, and therefore did not have photo-sensitivity. It was stable to light, and the physical strength of the relief image itself also increased.

While the invention has been described in detail and with reference to specific embodiments thereof, it will be apparent to one skilled in the art that various changes and modifications can be made therein without departing from the spirit and scope thereof.

What we claim is:

1. The process for forming an image, which comprises imagewise exposing a photo-sensitive image-forming material comprising a support having formed thereon a layer of a photo-sensitive composition containing an o-quinonediazide compound and a thermoplastic binder, said photo-sensitive composition being solid and not adhesive at ordinary temperatures, but softenable upon heating, heating the exposed photo-sensitive material in intimate contact with a peeling development carrier sheet which has no adhesive coating and which is nontacky at ordinary temperature to a temperature above the softening temperature of the photo-sensitive composition, the heating temperature being high enough to obtain sufficient adhesion between the photo-sensitive composition and the peeling development carrier sheet such that quality images can be peeled from the support but low enough that the photo-sensitive composition and the peeling development carrier sheet are not softened to the point at which good image quality is not obtained, and peeling the carrier sheet and the image-forming material from each other at a temperature below said heating temperature to thereby transfer and adhere the exposed area of the photo-sensitive composition layer to the carrier sheet and simultaneously form a negative relief image on the carrier sheet, and a positive relief image corresponding to the non-transferred area of the photo-sensitive composition layer on the support.

2. The process of claim 1 wherein said thermoplastic photo-sensitive composition contains a thermoplastic binder selected from the group consisting of vinylidene chloride, vinylidene chloride-acrylonitrile copolymer and polyvinyl butyral.

3. The process of claim 1 wherein said peeling development carrier sheet is a laminate of an ionomer or a thermoplastic polymer on a polyester support.

4. The process of claim 1 wherein said peeling development carrier sheet is a polyvinyl chloride film, a polystyrene film, a polyester film or a cellulose acetate film.

5. The process of claim 1, wherein said heating temperature is 60° to 300° C.

6. The process of claim 1, wherein said peeling temperature is below the softening point of said photo-sensitive composition and said peeling development carrier sheet.

7. The process of claim 1, wherein said peeling temperature is from room temperature to 200° C.

8. The process of claim 1, wherein said photo-sensitive composition has a softening point at least 10° C. higher than ordinary temperatures.

9. The process of claim 1, wherein said layer of said photo-sensitive composition and said peeling development carrier sheet have a softening point equal to or higher than 50° C.

10. The process of claim 1, wherein said intimate contact between said layer of photo-sensitive composition and peeling development carrier sheet is accomplished by passing said image-forming material and said carrier sheet in superposed relation between a plurality of heated rollers under pressure.

11. The process of claim 1 wherein the peeling development carrier sheet is a plastic film selected from the group consisting of plastic films of thermoplastic polymers and copolymers.

12. The process of claim 1 wherein the peeling development carrier sheet is a plastic film selected from the group consisting of plastic films of polyvinyl chloride, polyvinylidene chloride, polystyrene, polyethylene, polypropylene, polyamides, polyesters, cellulose acetate, polyurethane and polyurea.

13. The process of claim 1 wherein the peeling development carrier sheet is selected from the group consisting of paper, metal foil and cloth.

14. The process of claim 1 wherein the thermoplastic binder is selected from the group consisting of (A) linear polymers selected from the group consisting of polyvinyl butyral, polyvinyl formal, polystyrene, poly(methyl methacrylate), polyvinyl acetate, polyesters, polyamines, polyurethane and polyamides, (B) binary copolymers selected from the group consisting of vinylidene/acrylonitrile copolymer, styrene/acrylonitrile copolymer, vinyl methyl ether/maleic anhydride copolymer, vinyl acetate/maleic anhydride copolymer, vinyl chloride/vinyl acetate copolymer, and vinyl chloride/styrene copolymer, (C) ternary or quaternary copolymers containing third and fourth comonomers, and (D) partially water-soluble polymers selected from the group consisting of gelatin, polyvinyl alcohol and polyvinyl pyrrolidone.

15. The process of claim 1 wherein the thermoplastic binder is selected from the group consisting of epoxy resin mixed with thermoplastic binders and epoxy resins mixed with non-thermoplastic additives which substantially impart heat-softenability to the photo-sensitive composition layer.

16. The process of claim 1 wherein the thermoplastic binder is a mixture of a polymeric binder and a material selected from the group consisting of polyethylene glycol, rosin and wax.

17. The process for forming an image, which comprises imagewise exposing a photo-sensitive image-forming material consisting of a support having formed thereon a layer of a photo-sensitive composition containing an o-quinonediazide compound and a thermoplastic binder, said photo-sensitive composition being solid and not adhesive at ordinary temperatures, but softenable upon heating, heating the exposed photo-sensitive material in intimate contact with a peeling development carrier sheet which has no adhesive coating and which is non-tacky at ordinary temperature to a temperature above the softening temperature of the photo-sensitive composition, the heating temperature being high enough to obtain sufficient adhesion between the photo-sensitive composition and the peeling development carrier sheet such that quality images can be peeled from the support but low enough that the photo-sensitive composition and the peeling development carrier sheet are not softened to the point at which good image quality is not obtained, and peeling the carrier sheet and the image-forming material from each other at a temperature below said heating temperature to thereby transfer and adhere the exposed area of the photo-sensitive composition layer to the carrier sheet and simultaneously form a negative relief image on the carrier sheet, and a positive relief image corresponding to the non-transferred area of the photo-sensitive composition layer on the support.

* * * * *